United States Patent
Nguyen et al.

(10) Patent No.: US 9,209,599 B2
(45) Date of Patent: Dec. 8, 2015

(54) SYMMETRICAL, DIRECT COUPLED LASER DRIVERS

(71) Applicant: Maxim Integrated Products, Inc., San Jose, CA (US)

(72) Inventors: James Cong Nguyen, Portland, OR (US); Ashok Kumar Verma, Beaverton, OR (US)

(73) Assignee: Maxim Integrated Products, Inc., San Jose, CA (US)

( * ) Notice: Subject to any disclaimer, the term of this patent is extended or adjusted under 35 U.S.C. 154(b) by 0 days.

(21) Appl. No.: 14/635,782

(22) Filed: Mar. 2, 2015

(65) Prior Publication Data

US 2015/0188288 A1 Jul. 2, 2015

Related U.S. Application Data

(63) Continuation of application No. 13/352,011, filed on Jan. 17, 2012, now Pat. No. 8,971,365.

(60) Provisional application No. 61/440,539, filed on Feb. 8, 2011.

(51) Int. Cl.
| | | |
|---|---|---|
| *H01S 3/10* | (2006.01) | |
| *H01S 5/042* | (2006.01) | |
| *H03K 19/018* | (2006.01) | |
| *H01S 5/026* | (2006.01) | |

(52) U.S. Cl.
CPC ............... *H01S 5/042* (2013.01); *H01S 5/0261* (2013.01); *H03K 19/01837* (2013.01); *H01S 5/0427* (2013.01)

(58) Field of Classification Search
CPC .... H01S 3/0912; H01S 5/042; H01S 3/09702; H05B 41/30
See application file for complete search history.

(56) References Cited

U.S. PATENT DOCUMENTS

| | | | |
|---|---|---|---|
| 6,801,556 B2 | 10/2004 | Fischer | |
| 7,003,007 B2 * | 2/2006 | Murata et al. | ............ 372/38.02 |
| 7,068,692 B2 | 6/2006 | Chang | |
| 7,181,100 B2 | 2/2007 | Douma | |
| 7,457,336 B2 | 11/2008 | Takasou et al. | |
| 2003/0091077 A1 | 5/2003 | Fischer | |

(Continued)

FOREIGN PATENT DOCUMENTS

JP 63-90037 4/1988

OTHER PUBLICATIONS

"ADN2526 11.3 Gbps Active Back-Termination, Differential Laser Diode Driver", Analog Devices, Inc., Norwood, MA, (Aug. 2009), pp. 1-16.

(Continued)

*Primary Examiner* — Tuan Nguyen
(74) *Attorney, Agent, or Firm* — Blakely Sokoloff Taylor & Zafman LLP

(57) ABSTRACT

Symmetrical, direct coupled laser drivers for high frequency applications. The laser drivers are in integrated circuit form and use a minimum of relatively small (low valued) external components for driving a laser diode coupled to the laser driver through transmission lines. An optional amplifier may be used to fix the voltage at an internal node at data frequency spectrum to improve circuit performance. Feedback to a bias input may also be used to fix the voltage at the internal node. Programmability and a burst mode capability may be included.

18 Claims, 2 Drawing Sheets

(56) References Cited

U.S. PATENT DOCUMENTS

| | | |
|---|---|---|
| 2004/0258115 A1 | 12/2004 | Murata et al. |
| 2009/0201052 A1 | 8/2009 | Sanduleanu et al. |
| 2009/0268767 A1 | 10/2009 | Nelson |
| 2010/0183318 A1* | 7/2010 | Tanaka .................. 398/201 |

OTHER PUBLICATIONS

"MAX3656 155Mbps to 2.5Gbps Burst-Mode Laser Driver", Maxim Integrated Products, Inc., Sunnyvale, CA, (Sep. 2010), pp. 1-15.

"MAX3946 1.0625Gbps to 11.3Gbps, SFP+ Laser Driver with Laser Impedance Mismatch Tolerance", Maxim Integrated Products, Inc., Sunnyvale, CA, (Mar. 2010), pp. 1-28.

"ONET4201LD 155-Mbps to 4.25-Gbps Laser Driver", Texas Instruments Incorporated, Dallas, TX, (Sep. 2009), 29 pp. total.

Shih, Tien-Tsorng, et al., "High-Performance and Low-Cost 10Gbps Coaxial DFB Laser Module Packaging by Conventional TO-Can Materials and Processes", *Proceedings of the 2006 IEEE Electronic Components and Technology Conference*, (2006), pp. 1095-1100.

"Office Action Dated May 28, 2015; Chinese Patent Application No. 201210026163.8", (May 28, 2015).

* cited by examiner

SYMMETRICAL, DIRECT COUPLED LASER DRIVERS

CROSS-REFERENCE TO RELATED APPLICATIONS

This application is a continuation of U.S. patent application Ser. No. 13/352,011 filed Jan. 17, 2012 which claims the benefit of U.S. Provisional Patent Application No. 61/440,539 filed Feb. 8, 2011.

BACKGROUND OF THE INVENTION

1. Field of the Invention

The present invention relates to the field of laser drivers, and more particularly to laser drivers for high frequency applications.

2. Prior Art

Laser drivers are well known in the prior art. However, current operating requirements at increased frequencies, lower voltages and higher efficiencies exceed the performance of current designs. Representative prior art laser driver designs may be found in U.S. Pat. Nos. 7,181,100 and 7,457,336, US Published Application Nos. 2009/0268767 and 2009/0201052. Some products currently on the market are described in data sheets MAX3656 and MAX3946 (Maxim Integrated Products, Inc.), ONET4201LD (Texas Instruments) and ADN2526 (Analog Devices).

DETAILED DESCRIPTION OF THE PREFERRED EMBODIMENTS

Figure 1:
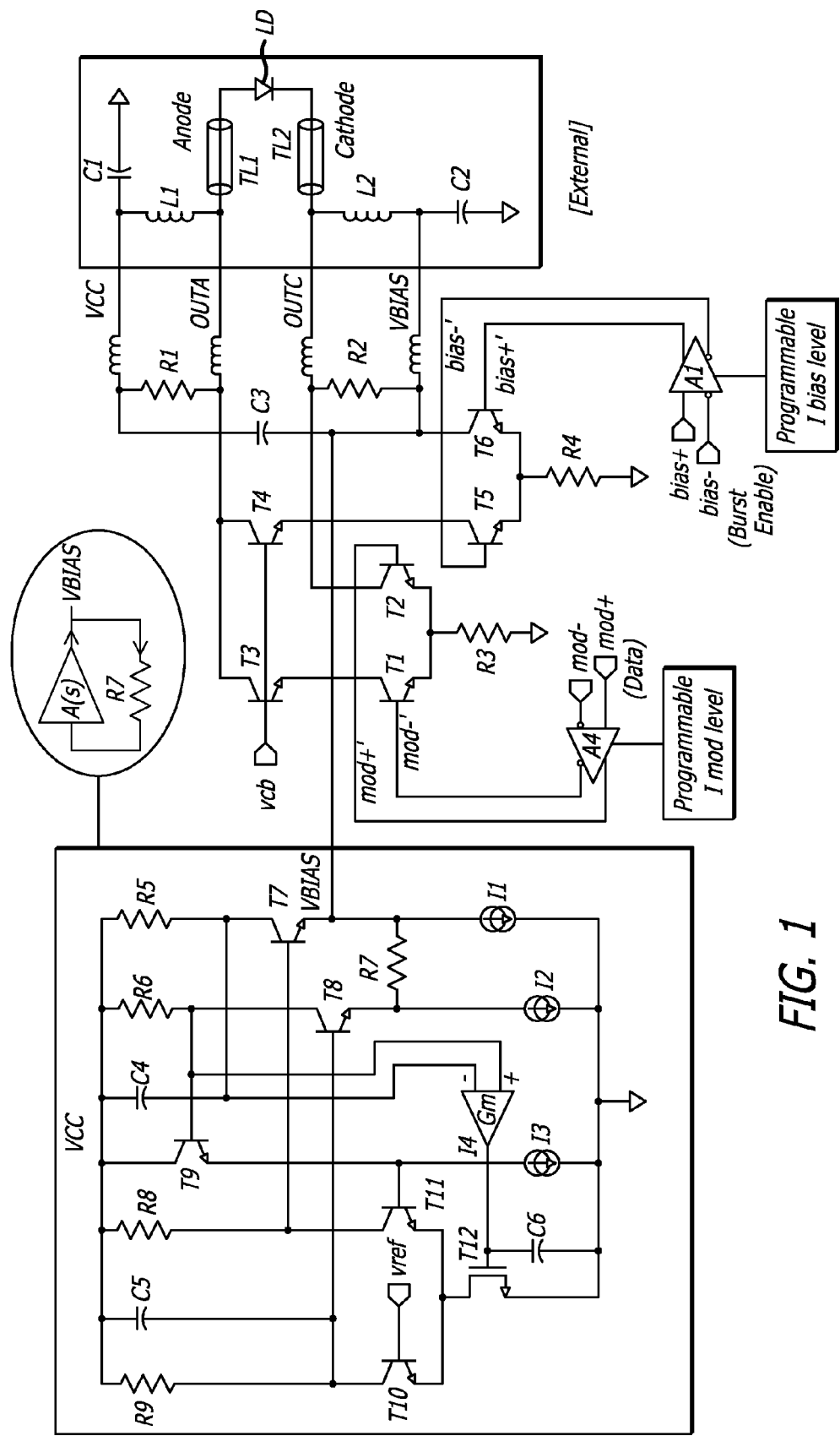
FIG. 1 is simplified circuit diagram of an embodiment of the present invention.

Referring to FIG. 1, a circuit diagram for a preferred embodiment of the present invention may be seen. The circuitry in the rectangular outline labeled "External" is the only external circuitry needed, with the other circuitry shown being within a single integrated circuit. The external circuitry includes the laser diode LD coupled to the integrated circuit terminals OUTA and OUTC through transmission lines TL1 and TL2. An inductor L1 is connected between integrated circuit terminals VCC and OUTA, and a bypass capacitor is connected between VCC and the circuit ground. An inductor L2 is connected between the OUTC and the VBIAS terminals, and capacitor C2 is connected between the VBIAS terminal and the circuit ground.

The outputs OUTA and OUTC coupled through the transmission lines to the anode and cathode of the laser diode LD, respectively, are connected to the collectors of transistors T3 and T2, respectively. Transistor T3, biased by the bias voltage vcb, is a cascode transistor for transistor T1 of the differential transistor pair T1 and T2, which have their emitters coupled together and to ground through resistor R3. The collector of transistor T3 is coupled to the anode connection of laser diode LD through output terminal OUTA and transmission line TL1, and to the VCC terminal of the integrated circuit through resistor R1 and external inductor L1. No cascode transistor is used for transistor T2 of the differential pair because of the lack of voltage headroom, the headroom for cascode transistor T3 effectively being provided by the voltage drop across laser diode LD itself. Note that the drive provided by transistors T1 and T2 is a symmetrical differential drive for the laser diode LD.

The inputs to the bases of the differential pair T1 and T2 are the differential data inputs mod−' and mod+', respectively, which are the outputs of amplifier A4. Amplifier A4 provides a plus and minus differential output having a fixed differential voltage, with voltages set by the programmable I mod level block and with a state responsive to the inputs mod+ and mod−. With this connection, the transistor that is on at any one time (T1 or T2) will conduct a current equal to its base voltage minus its Vbe, all divided by the R3. Thus transistors T1 and T2 act as current sources so that rather than being on and off, each act as a current source or is off, responsive to the digital data inputs mod+ and mod−. User programmability of circuits and control loops in general are well known in the art, as is the biasing of a transistor as a current source, and accordingly are not shown in detail herein. As an alternative, the resistor R3 might be a programmable current source, though there may not be enough voltage headroom for such an embodiment, depending on the voltage VCC of the power source.

A second differential transistor pair T5 and T6 have their emitters connected together and to the circuit ground through resistor R4. The collector of transistor T5 is connected to cascode transistor T4 having its base and collector connected in common with the base and collector of cascode transistor T3, respectively. Transistor T6 has its collector connected through capacitor C3 to the VCC terminal of the integrated circuit, and to resistor R2. The other end of resistor R2 is connected to the collector of transistor T2 and to the cathode of the laser diode LD through integrated circuit terminal OUTC and transmission line TL2. The bases of transistors T5 and T6 are coupled as burst enable inputs bias−' and bias+', respectively, from amplifier A1 which controls the base voltages of transistors T5 and T6 responsive to the signals bias+ and bias−, and at voltage levels set by the Programmable I bias level block. Thus transistors also act as separately user programmable current sources like those of transistors T1 and T2 for the digital data inputs mod+ and mod−. In FIG. 1, the connections between the integrated circuit and the terminals VCC, OUTA, OUTC and VBIAS are shown as inductors, as the inductance of these connections at the high frequencies at which the present invention operates is meaningful and should be taken into consideration.

In one embodiment, additional circuitry is added to the input circuitry, namely to override the data inputs mod− high and mod+ low when bias− is high and bias+ is low, independent of any actual data inputs the circuit may receive. This allows multiple laser drivers to share a communication channel in a time division multiplexing scheme where only one transmitter is enabled at any times. Of course the override is immediately released when bias+ goes high and bias− goes low (output burst enabled). As an example, such an override can be implemented various ways using simple logic functions.

The impedance of the typical laser diode is on the order of 5 to 10 ohms differentially, so there is a substantial impedance mismatch between the transmission lines (25 ohm transmission lines or 50 ohm differentially in one embodiment) coupled to the laser diode LD. However, resistors R1 and R2 are chosen to match the transmission lines, and provide the termination for the signal reflected back from the laser diode LD through the transmission lines, resistor R1 being directly connected to VCC and R2 being AC coupled to VCC through capacitor C3 at the frequencies of operation. Thus there is symmetry in the external circuitry as well as in the drive and termination of the 25 ohm transmission lines.

When the output burst is not enabled (and mod– is held high and mod+ is held low as previously described), there is no current through the laser diode LD as there is no DC connection to its cathode. Thus there is no light emission from the laser diode. The voltage at OUTA is essentially VCC, i.e., the voltage across inductor L1 is essentially zero because of its low resistance. When the output burst is enabled and mod+ is high for transmitting a "1", current flows through the laser diode LD, with a primary current path through transistor T2 and resistor R3 to the circuit ground, transistor T2 acting as a current source controlled by the output voltage levels of amplifier A4, which in turn provides output voltage levels controlled by the programmable I mod level block).

When the output burst is enabled and Mod– is high for transmission of a "0", transistor T2 will be off. Now the component of the current through the laser diode LD and transistor T2 is off, so that the only remaining component of current is that though resistor R2, transistor T6 and resistor R4. Note that in essence, transistors T2 and T1 steer the current component of the current sources of transistors T2 and T1 through the laser diode LD through and around the laser diode, respectively. This in turn means that the average current through external inductor L1 is constant, independent of whether a "1" or a "0" is being transmitted.

It may be seen from the foregoing that the structure of the laser driver just described and illustrated in FIG. 1 is a symmetrical, differential direct coupled laser driver structure with burst mode capabilities. Of particular interest is the fact that the data and bias loops are coupled together, the current for the transmission of a "1" being coupled through the bias loop.

Circuit performance may be optionally improved by actively fixing the voltage of the node VBIAS, at least with respect to high frequency signals (i.e., signals in the data frequency spectrum, as opposed to low frequencies which are frequencies well below the data frequency spectrum). For this purpose, the optional circuit in the box at the left of FIG. 1 can be added. This circuit is, in essence, an amplifier A(s) with a complex transfer function and with a feedback resistor R7 as shown in the oval outline in FIG. 1. It has an output impedance for the output VBIAS that is very low at the high frequencies, i.e., looks like a voltage source, but which is very high for low frequencies, i.e., looks like a current source. At high frequencies, it can be considered to make capacitor C3 look very large, thereby improving the termination of the cathode and thus the circuit balance. At low frequencies, the circuit will seek an output VBIAS equal to the average voltage on the node to which it is connected.

Now referring to the circuit to the left of FIG. 1 within the outline, transistor T7 is coupled through resistor R5 as an emitter follower biased by current source I1. The circuit to the left of transistor T7 is an amplifier responsive at high frequencies to changes in the voltage on the emitter of transistor T7, the voltage VBIAS, by feedback through resistor R7, to adjust the voltage on the base of transistor T7 to cancel or greatly reduce such changes.

In particular, a change in the voltage VBIAS changes the current through transistor T8, changing the voltage drop across resistor R6, coupling that change through the base emitter voltage of transistor T9 biased by current source I3 to the base of transistor T11. This changes the current through transistor T11 which causes the voltage drop through resistor R8 to change, feeding this change back to the base of transistor T7 to resist the change in VBIAS that initiated the disturbance.

The bases of transistors T7 and T8 are coupled to VCC through resistors R8 and R9, respectively, and to the collectors of differential transistor pair T11 and T10, respectively. The base of transistor T10 is connected to a reference voltage, with the common emitter connection of transistors T10 and T11 being biased by the current through transistor T12. The voltage on capacitor C6 connected to the gate of transistor T12 integrates the output of the voltage controlled current source 14 (transconductance Gm), which is proportional to the difference in voltages on the collectors of transistors T7 and T8. If at a low frequency (relative to the data frequencies), VBIAS changes, that will cause a current through resistor R5, which in turn will cause a change in voltage on capacitor C4. That causes a voltage difference across voltage controlled current source 14, unbalancing the voltage across the voltage controlled current source 14 to charge or discharge capacitor C6 until the circuit settles at the new value of VBIAS.

Capacitor C4 provides a capacitive load on the collector of transistor T7 at data frequencies to limit the fluctuations of the voltage on the collector of transistor T7 to avoid saturation of the transistor. Capacitor C5, on the other hand, determines the circuit response to frequencies in a mid-frequency range.

Figure 2:
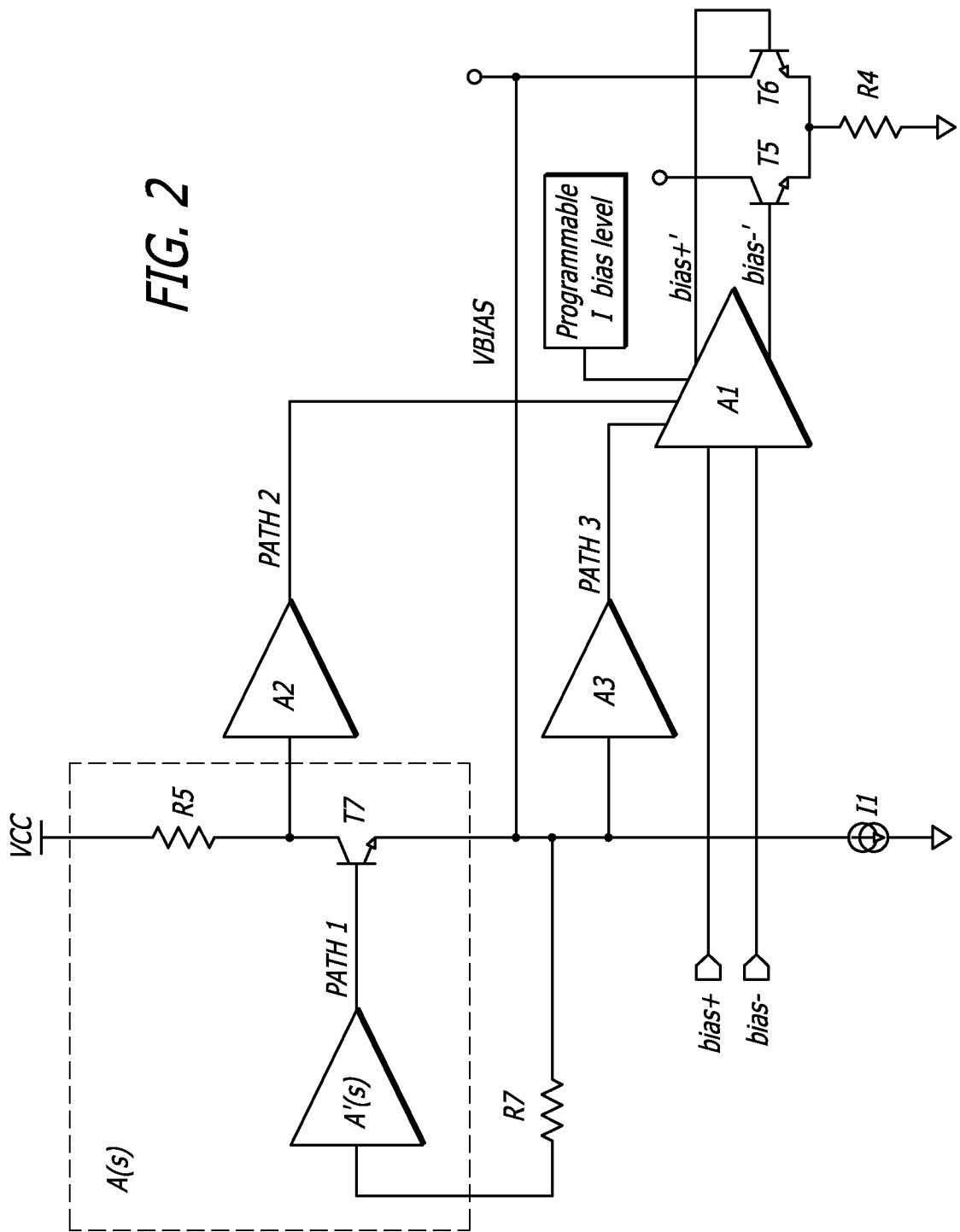
FIG. 2 is simplified circuit diagram of another embodiment of the present invention.

As an alternative to the circuit at the left of FIG. 1, the disturbances in VBIAS at data frequencies may be substantially eliminated using the circuit of FIG. 2. This circuit, like that of FIG. 1, senses any attempted change in VBIAS at data frequencies, but in addition to directly adjusting VBIAS, provides feedback to transistors T5 and T6 so that transistor T6 will also provide (or absorb) the current component that is attempting to vary VBIAS at the data frequencies. The end result is the same as that achieved by the circuit at the left of FIG. 1, though the feedback is both directly to VBIAS itself as in the circuit of FIG. 1, and indirectly to VBIAS through transistor T6.

Referring again to FIG. 2, resistors R4, R5 and R7, transistors T5, T6 and T7, current source I1 and signals bias+ and bias– are the same as in FIG. 1, the rest of the right side of FIG. 1 being omitted in FIG. 2 for clarity, though could be identical to that of FIG. 1. In operation, resistor R7 senses any change in the VBIAS voltage, which change is amplified by amplifier A'(s) and fed back to the base of transistor T7. Amplifier A'(s) can have a transfer function f(s) that produces the same VBIAS voltage characteristics (acts like a voltage source at data frequencies and as a current source at low frequencies) as the circuit in the box at the left of FIG. 1. Actually taking out amplifiers A2 and A3, the circuit shown in FIG. 2 may be considered a simplified representation of the corresponding part of the circuit of FIG. 1.

Amplifier A1 is shown in FIG. 1, though with only one programmable input for bias control. In FIG. 2, additional inputs are provided for control through amplifiers A2 and/or A3. Normally both path 2 and path 3 would not be used, and without path 2 and path 3, but only path 1, one has a simplified version of the respective part of the circuit of FIG. 1. Again, paths 1, 2 and 3 may be eliminated, though performance is improved and the size of the external components, especially inductor L2 and capacitor C2 may be reduced by using at least feedback path 1, as previously described. Also if path 2 is used (i.e., paths 1 and 2 are used), then capacitor C4 may be eliminated, or substantially reduced in capacitance.

The present invention has been disclosed and described with respect to npn transistors, though it should be noted that it can be implemented in other technologies, such as by way of example, using NMOS transistors. In any case, each transistor, regardless of type, may be characterized as having first, second and third terminals wherein the voltage between the first (emitter or source) and second terminals (base or gate)

controls the conduction of current between the third (collector or drain) and first (emitter or source) terminals. Also transistors T3 and T4 are cascode transistors, and may be eliminated if desired, as long as transistors T1 and T5 can handle the higher voltage that they will be subjected to. In that regard, the topology of the invention may be inverted and implemented with transistors of the opposite conductivity type.

There have been disclosed herein symmetrical, differential direct coupled laser driver structures with burst mode capabilities that operate on low supply voltages with high efficiency. While certain preferred embodiments of the present invention have been disclosed and described herein for purposes of illustration and not for purposes of limitation, it will be understood by those skilled in the art that various changes in form and detail may be made therein without departing from the spirit and scope of the invention.

What is claimed is:

1. A laser diode driver for coupling to a laser diode circuit, the laser diode circuit having a first laser diode circuit connection for coupling to a first power supply terminal, the first laser diode circuit connection being coupled to a first terminal of a first inductor, a second terminal of the first inductor being coupled to a first terminal of a laser diode and to a second laser diode circuit connection, a second terminal of the laser diode being coupled to a first terminal of a second inductor and to a third laser diode circuit connection, and a second terminal of the second inductor being coupled to a fourth laser diode circuit connection and through a first capacitor for coupling to a second power supply terminal;
the laser diode driver comprising:
a first current source including circuitry for controllably coupling a first current to the second laser diode circuit connection or to the fourth laser diode circuit connection responsive to an enable or bias input signal;
a second current source including circuitry for controllably coupling a second current to the second laser diode circuit connection or to the third laser diode circuit connection responsive to a data input signal.

2. The laser diode driver of claim 1 wherein the first and second current sources are programmable.

3. The laser diode driver of claim 1 further comprising a first resistor coupled between the first laser diode circuit connection and the second laser diode circuit connection, and a second resistor coupled between the third laser diode circuit connection and the fourth laser diode circuit connection.

4. The laser diode driver of claim 1 further comprising a circuit coupled to the fourth laser diode circuit connection, the circuit having a low impedance at data input signal frequencies and a high impedance at frequencies that are lower than data input signal frequencies.

5. The laser diode driver of claim 1 further comprised of an amplifier circuit having an amplifier output coupled to the fourth laser diode circuit connection, the amplifier circuit having a low impedance at data input signal frequencies and a high impedance at frequencies that are lower than data input signal frequencies.

6. The laser diode driver of claim 5 wherein the amplifier circuit comprises an amplifier having its output coupled to its input and having a complex transfer function.

7. The laser diode driver of claim 1 further comprising an active circuit coupled to the fourth laser diode circuit connection, the active circuit acting as a voltage source at data input signal frequencies and as a current source at frequencies that are lower than data input signal frequencies.

8. The laser diode driver of claim 1 further comprising a second capacitor coupled between the first laser diode circuit connection and the fourth laser diode circuit connection.

9. A laser diode driver for coupling to a laser diode circuit, the laser diode circuit having a first laser diode circuit connection for coupling to a first power supply terminal, the first laser diode circuit connection being coupled to a first terminal of a first inductor, a second terminal of the first inductor being coupled to a first terminal of a laser diode and to a second laser diode circuit connection, a second terminal of the laser diode being coupled to a first terminal of a second inductor and to a third laser diode circuit connection, and a second terminal of the second inductor being coupled to a fourth laser diode circuit connection and through a first capacitor for coupling to a second power supply terminal;
the laser diode driver comprising:
a first programmable current source including circuitry for controllably coupling a first current to the second laser diode circuit connection of the laser diode circuit or to the fourth laser diode circuit connection of the laser diode circuit responsive to an enable input signal;
a second programmable current source including circuitry for controllably coupling a second current to the second laser diode circuit connection of the laser diode circuit or to the third laser diode circuit connection responsive to an enable input signal;
a first resistor coupled between the first laser diode circuit connection and the second laser diode circuit connection, and a second resistor coupled between the third laser diode circuit connection and the fourth laser diode circuit connection.

10. The laser diode driver of claim 9 further comprising a circuit coupled to the fourth laser diode circuit connection, the circuit having a low impedance at data input signal frequencies and a high impedance at frequencies that are lower than data input signal frequencies.

11. The laser diode driver of claim 9 further comprised of an amplifier circuit having an amplifier output for coupling to the fourth laser diode circuit connection, the amplifier circuit having a low impedance at data input signal frequencies and a high impedance at frequencies that are lower than data input signal frequencies.

12. The laser diode driver of claim 11 wherein the amplifier circuit comprises an amplifier having its output coupled to its input and having a complex transfer function.

13. The laser diode driver of claim 9 further comprising an active circuit coupled to the fourth laser diode circuit connection, the active circuit acting as a voltage source at data input signal frequencies and as a current source at frequencies that are lower than data input signal frequencies.

14. A laser diode driver for coupling to a laser diode circuit, the laser diode circuit having a first laser diode circuit connection for coupling to a first power supply terminal, the first laser diode circuit connection being coupled to a first terminal of a first inductor, a second terminal of the first inductor being coupled to a first terminal of a laser diode and to a second laser diode circuit connection, a second terminal of the laser diode being coupled to a first terminal of a second inductor and to a third laser diode circuit connection, and a second terminal of the second inductor being coupled to a fourth laser diode circuit connection and through a first capacitor for coupling to a second power supply terminal;
the laser diode driver comprising:
a first programmable current source including circuitry for controllably coupling a first current to the second laser diode circuit connection of the laser diode circuit or to the fourth laser diode circuit connection of the laser diode circuit responsive to an enable input signal;

a second programmable current source including circuitry for controllably coupling a second current to the second laser diode circuit connection of the laser diode circuit or to the first laser diode circuit connection responsive to an enable input signal;

a first resistor coupled between the first laser diode circuit connection and the second laser diode circuit connection, and a second resistor coupled between the third laser diode circuit connection and the fourth laser diode circuit connection;

an active circuit coupled to the fourth laser diode circuit connection, the active circuit acting as a voltage source at data input signal frequencies and as a current source at frequencies that are lower than data input signal frequencies.

15. The laser diode driver of claim 14 further comprising a second capacitor coupled between the first laser diode circuit connection and the fourth laser diode circuit connection.

16. A laser diode driver for coupling to a laser diode circuit, the laser diode circuit having a first inductor having a first terminal for coupling to a power supply, a second terminal of the first inductor being coupled to a first terminal of a laser diode, a second terminal of the laser diode being coupled to a first terminal of a second inductor;

the laser diode driver comprising:

a first current source including circuitry for controllably coupling a current through the first inductor or a current through the first inductor and the laser diode responsive to an enable or bias input signal;

a second current source including circuitry for controllably coupling a current to the first laser diode circuit connection or to the second laser diode circuit connection responsive to a data input signal;

a circuit coupled to the second terminal of the second inductor acting as a voltage source at the data signal frequencies and as a current source at frequencies lower than the data signal frequencies;

the first and second current sources being programmable.

17. The laser driver of claim 16 wherein the first current source controllably couples a current through the first inductor or a current through the first inductor, the laser diode and the second inductor responsive to an enable or bias input signal.

18. A laser diode driver for coupling to a laser diode circuit, the laser diode circuit having a first inductor having a first terminal for coupling to a first power supply connection, a second terminal of the first inductor being coupled to a first terminal of a laser diode, a second terminal of the laser diode being coupled to a first terminal of a second inductor, and a second terminal of the second inductor being coupled through a capacitor to a second power supply connection;

the laser diode driver comprising:

a first current source including circuitry for controllably coupling a current through the first inductor or a current the first inductor and the laser diode responsive to an enable or bias input signal;

a second current source including circuitry for controllably coupling a current to the first laser diode circuit connection or to the second laser diode circuit connection responsive to a data input signal;

the first and second current sources being programmable.

* * * * *